United States Patent [19]

Hayakawa et al.

[11] 4,151,543
[45] Apr. 24, 1979

[54] LEAD ELECTRODE STRUCTURE FOR A SEMICONDUCTOR CHIP CARRIED ON A FLEXIBLE CARRIER

[75] Inventors: Masao Hayakawa, Kyoto; Takamichi Maeda; Masao Kumura, both of Nara, all of Japan

[73] Assignee: Sharp Kabushiki Kaisha, Osaka, Japan

[21] Appl. No.: 786,841

[22] Filed: Apr. 12, 1977

[30] Foreign Application Priority Data

Apr. 13, 1976 [JP] Japan ................................ 51/42232

[51] Int. Cl.² .................... H01L 23/48; H01L 29/44; H01L 29/52
[52] U.S. Cl. ........................................ 357/65; 357/67; 357/68; 357/69; 357/71
[58] Field of Search ....................... 357/67, 68, 70, 74, 357/71, 69, 65

[56] References Cited

U.S. PATENT DOCUMENTS

| | | | |
|---|---|---|---|
| 3,480,836 | 11/1969 | Aronstein | 357/74 |
| 3,724,068 | 4/1973 | Galli | 357/74 |
| 3,780,352 | 12/1973 | Redwanz | 357/74 |
| 3,781,596 | 12/1973 | Galli et al. | 357/74 |
| 3,793,714 | 2/1974 | Bylander | 357/70 |
| 3,832,769 | 9/1974 | Olyphant et al. | 357/70 |
| 3,968,563 | 7/1976 | Hamlin | 357/70 |
| 4,024,570 | 5/1977 | Hartmann | 357/74 |
| 4,027,236 | 5/1977 | Kummer et al. | 357/70 |
| 4,045,863 | 9/1977 | Mitterhummer | 357/70 |

*Primary Examiner*—Andrew J. James
*Attorney, Agent, or Firm*—Birch, Stewart, Kolasch & Birch

[57] ABSTRACT

A semiconductor device comprises an insulating substrate such as a film carrier having wiring patterns formed thereon, lead electrodes connected to the wiring patterns, and a semiconductor chip bonded to the lead electrodes. The surface of the lead electrodes, to which the semiconductor chip is bonded, is smooth as compared with that of the wiring patterns, thereby ensuring accurate operation of the semiconductor device.

8 Claims, 8 Drawing Figures

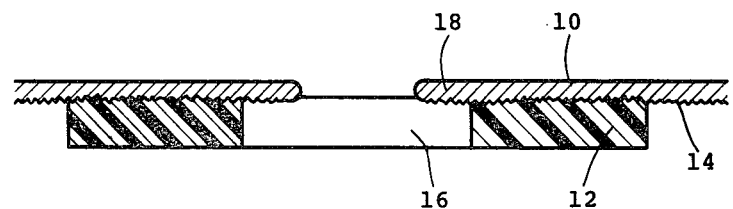
PRIOR ART   FIG. 1
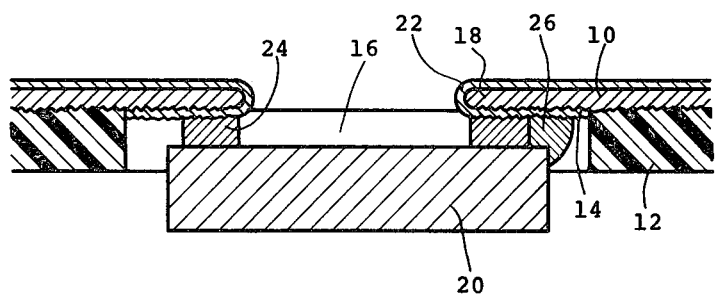
PRIOR ART   FIG. 2
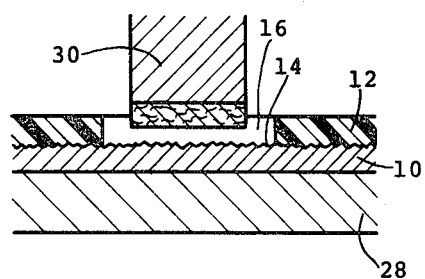
FIG. 3

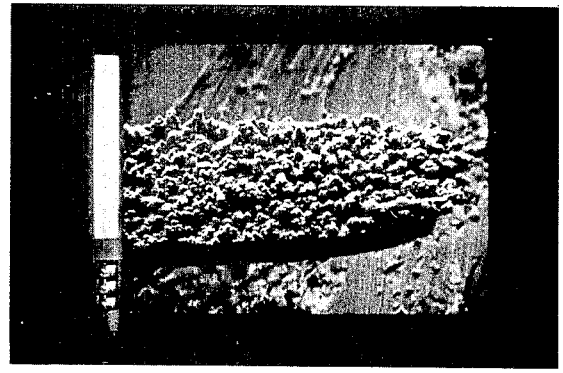
PRIOR ART   FIG. 4
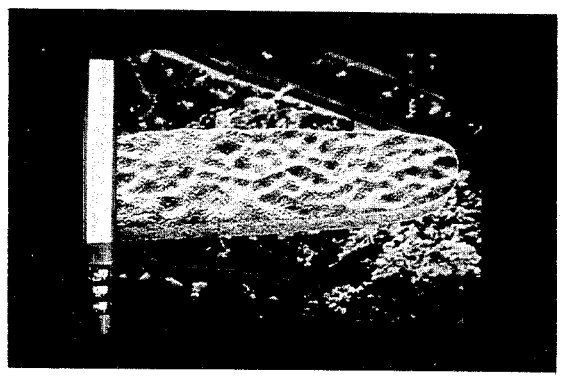
FIG. 5

LEAD ELECTRODE STRUCTURE FOR A SEMICONDUCTOR CHIP CARRIED ON A FLEXIBLE CARRIER

BACKGROUND AND SUMMARY OF THE INVENTION

The present invention relates to a semiconductor device and, more particularly, to a semiconductor device which includes a semiconductor chip bonded to an insulating substrate such as a film carrier.

A semiconductor device is proposed in U.S. Pat. No. 3,763,404, "SEMICONDUCTOR DEVICES AND MANUFACTURE THEREOF" patented on Oct. 2, 1973, wherein a semiconductor chip is bonded to lead electrodes formed on a flexible carrier made of, for example, a polyimide film. In the film carrier system, electrodes formed on the semiconductor chip are arranged so as to confront finger lead electrodes formed on the flexible carrier, and the electrodes formed on the semiconductor chip are simultaneously connected to the corresponding finger lead electrodes formed on the flexible carrier through the use of a bonding method.

Therefore, the above-mentioned film carrier system is suited for mass production. Moreover, the film carrier system has great advantages. For example, the film carrier system facilitates the fabrication of thin and small semiconductor devices.

However, the film carrier system of the prior art can not show a sufficient yield. And the semiconductor device formed by the film carrier system of the prior art can not tolerate the mechanical shock. The present inventors have discovered that the above defects are caused by the following facts. Generally, in the film carrier system, wiring patterns essentially made of copper are formed on the film carrier. In order to enhance the tight connection between the film carrier and the wiring patterns, it is necessary that roughness of three to fifteen micron (3–15μm) amplitude be formed on the surface of the copper film confronting the film carrier. One method for forming the roughness on the copper film surface is to mechanically rub the copper film surface. However, when the copper film is formed through the use of plating techniques, roughness of the three to fifteen microns (3–15μm) amplitude is unavoidably formed on the plated surface. Therefore, in the film carrier system, the copper film formed through the use of plating techniques is used to form the wiring patterns.

Accordingly, the finger lead electrode surfaces also have a roughness of the three to fifteen microns (3–15μm) amplitude. This roughness on the finger lead electrodes causes a capillary phenomenon during the bonding treatment Therefore, there is a possibility that an eutectic alloy created during the bonding treatment will flow along the rough surfaces by capillary action to form undersirable short circuits between the finger lead electrodes and the semiconductor chip. The thus formed short circuits will damage the semiconductor chip.

Accordingly, an object of the present invention is to provide an improved thin semiconductor device.

Another object of the present invention is to provide a semiconductor device carried on a film carrier.

Still another object of the present invention is to provide a semiconductor device carried on a film carrier, which shows accurate and stable operation.

Yet another object of the present invention is to provide a semiconductor device carried on a film carrier, which shows a good yield.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, the surface of the finger lead electrodes is smoothed, as compared with that of the wiring patterns, through the use of a mechanical polishing method, a press method, an electrolytic polishing method, or a slight etching method. By smoothing the finger lead electrode surface, the undersirable capillary phenomenon is prevented and, therefore, the semiconductor device can show accurate operation.

BRIEF DESCRIPTION OF THE DRAWINGS

The present invention will become more fully understood from the detiled description given hereinbelow and the accompanying drawings which are given by way of illustration only, and thus are not limitative of the present invention and wherein, FIG. 1 is a sectional view of a film carrier carrying wiring patterns and finger lead electrodes formed thereon in accordance with the prior art;

FIG. 2 is a sectional view of a semiconductor device of the prior art, wherein a semiconductor chip is bonded to the finger lead electrodes of FIG. 1;

FIG. 3 is a sectional view of one step for forming an embodiment of a semiconductor device of the present invention;

FIG. 4 is a perspective view of a finger lead electrode included within the semiconductor device of the prior art; and FIG. 5 is a perspective view of a finger lead electrode included within an embodiment of the semiconductor device of the present invention.

DESCRIPTION OF THE PREFERRED EMBODIMENTS

Figure 3A:
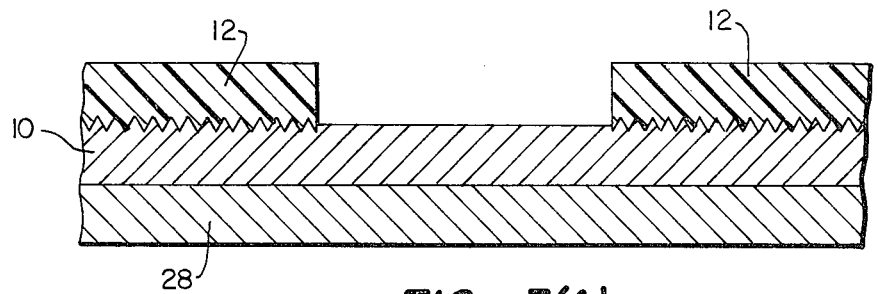
FIGS. 3(A) to 3(C) illustrate the resulting articles or products at three separate stages of performance of the method of the present invention.

Referring now in detail to the drawings, and to facilitate a more complete understanding of the present invention, a semiconductor device carried on a film carrier of the prior art will be first described with reference to FIGS. 1 and 2.

A copper film 10 is attached to a film carrier 12 made of a polyimide film. The copper film 10 is formed through the use of a plating method and, therefore, one surface thereof, which confronts the film carrier 12, has a roughness 14 of the three to fifteen microns (3–15μm) amplitude. An aperture 16 is formed in the film carrier 12, in which a semiconductor chip is secured. The copper film 10 is shaped in a desired pattern through the use of etching techniques so as to form wiring patterns formed on the film carrier 12 and finger lead electrodes 18 extended toward the aperture 16. The surface of the finger lead electrodes 18, to which the semiconductor ship is bonded, also has the roughness 14.

FIG. 2 shows a condition, where a semiconductor chip 20 is bonded to the finger lead electrodes 18 shown in FIG. 1. The surface of the wiring patterns and the finger lead electrodes 18 is coated with tin 22 through the use of a plating method. Bumps 24 made of, for example, gold are formed on the semiconductor chip 20 at positions corresponding to the finger lead electrodes 18. When the bonding operation is carried out to connect the bumps 24 to the finger lead electrodes 18, an eutectic alloy, for example, the eutectic alloy of Au-Sn is formed, whereby the semiconductor chip 20 is electrically and mechanically connected to the finger lead electrodes 18.

The eutectic alloy shows fluidity because of heat created during the bonding operation. The molten alloy will flow along the roughness 14 formed on the finger lead electrodes 18 due to capillary attraction and will reach the position where the bumps 24 are not formed as shown by the reference numeral 26 in FIG. 2. The eutectic alloy thus formed after undesirable flow will create undesirable short circuits, so called the chip touch phenomenon, whereby the semiconductor chip 20 is damaged.

FIG. 3 shows one step for forming an embodiment of a semiconductor device of the present invention. Like elements corresponding to those of FIG. 1 are indicated by like numerals.

The semiconductor device of the present invention is fabricated in the following manner. In this example, the semiconductor chip is mounted on a film carrier. However, the semiconductor device of the present invention can be formed on either the film carrier or a rigid substrate such as a glass substrate.

A strip of flexible film made of, for example, a polyimide film is first painted with adhesive. The flexible film is transported by a suitable means, whereby sprocket holes are formed in the both sides of the flexible film through the use a press method. Thereafter, the flexible film is transoprted through the use of the sprocket holes, whereby an aperture for securing a semiconductor chip and holes for cutting outer connection electrodes are formed at desired positions as is well known in the art.

A copper film is attached to the flexible film via the adhesive through the use of thermo press rollers. As is already discussed above, the copper film is preferably fabricated by a plating method. The surface of the copper film has roughness of three to fifteen microns (3-15μm) amplitude, which ensures tight connection between the flexible film and the copper film.

FIG. 3 shows a condition where the copper film 10 is attached to the film carrier 12. One surface of the copper film 10 has the roughness 14, which is exposed to the ambient at the aperture 16 where the semiconductor chip is to be secured. The flexible film 12 carrying the copper film 10 is supported by a supporting table 28 in such a manner that the roughness 14 formed at the aperture 16 faces upward. The roughness 14 formed at the aperture 16 is smoothed through the use of a mechanical polishing method, a press method, an electrolytic polishing method, or a slight etching method. The resulting smoothed article is illustrated in FIG. 3(A). The respective methods will be described in detail hereinbelow.

(1) MECHANICAL POLISHING

The surface of the copper film 10 exposed to the ambient at the aperture 16 is rubbed by a polishing tool 30 as shown in FIG. 3.

(2) PRESS

The surface of the copper film 10 exposed to the ambient at the aperture 16 is smoothed through the use of a coining tool to which a predetermined pressure is applied.

(3) ELECTROLYTIC POLISHING

The polyimide film carrying the copper film is dipped into an electrolyte made of phosphoric acid, or phosphoric acid including chromium trioxide, glue and/or propionic acid. The copper film is connected to the positive terminal to be dissolved, thereby smoothing the copper film surface.

(4) SLIGHT ETCHING

The copper film surface is slightly dissolved within the solvent of the following composition.

$H_2SO_4$:7
$HNOS_3$:3
HCl: 1-5
$H_2O$: 0-6

The electrolytic polishing method and the slight etching method are suited for mass production, since a batch treatment can be applied to either method.

Figure 3B:
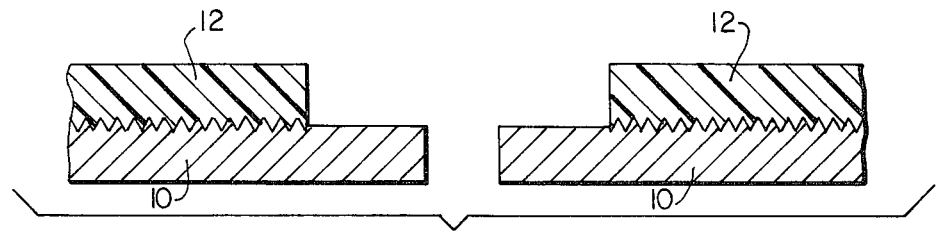

The thus formed copper film 10 is shaped in a desired configuration through the use of a conventional etching method to form wiring patterns formed on the film carrier 12, finger lead electrodes extended to the aperture 16, to which the semiconductor chip is bonded, and terminal electrodes for connecting the semiconductor device to the outer circuitry. The resulting product from this step of the method is illustrated in FIG. 3(B).

Figure 3C:
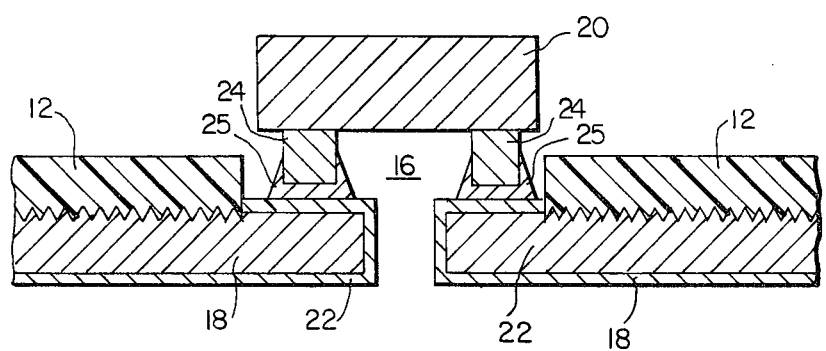
Figure 3A:
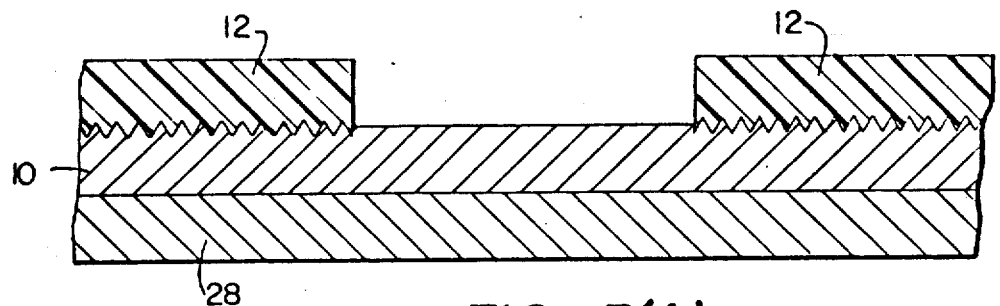
Figure 3B:
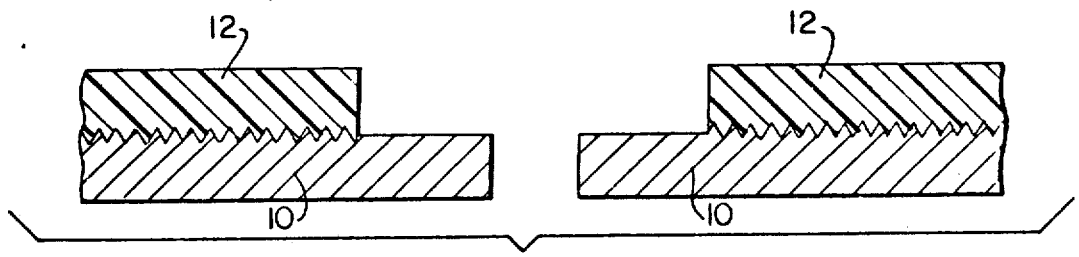
Figure 3C:
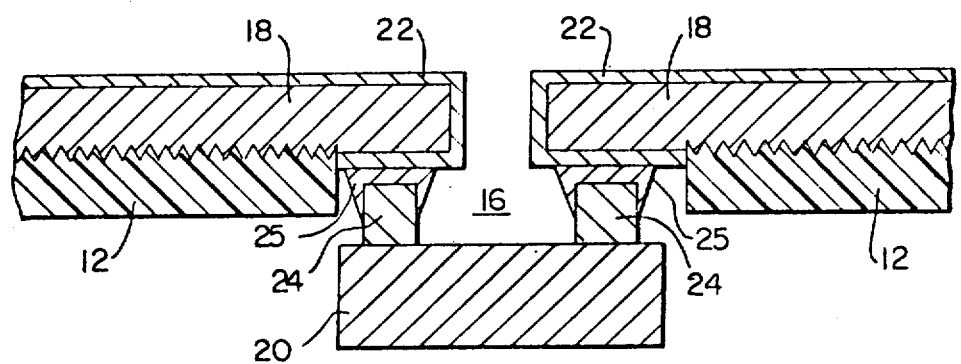

FIG. 4 shows the surface condition of the finger lead electrode of the prior art. FIG. 5 shows the surface condition of the finger lead electrode included within the semiconductor device of the present invention. It will be clear from FIGS. 4 and 5 that the roughness is considerably smoothed or decreased so that the above-mentioned erroneous short circuits will not occur. The finger lead electrode surface shown in FIG. 5 was smoothed through the use of the slight etching method referred to hereinbefore. The thus shaped copper film surface is then coated with tin through the use of a plating method. The semiconductor chip is arranged within the aperture 16 in such a manner that bumps formed on the semiconductor chip confront the finger lead electrodes and, thereafter, heat is applied so as to connect the bumps to the finger lead electrodes by forming the eutectic alloy. The resulting article from these steps is illustrated in FIG. 3(C).

In the foregoing embodiment, the etching treatment for shaping the finger lead electrodes is conducted after smoothing the copper film surface exposed at the aperture. However, the finger lead electrodes can be first shaped and, thereafter, the finger lead electrode surface can be smoothed. Moreover, the electrodes are not limited to be made of copper but other suited material can be applied.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A semiconductor device comprising:
   an insulating substrate;
   an aperture formed in the insulating substrate;
   wiring patterns formed on the insulating substrate;

finger lead electrodes extending toward said aperture and electrically connected to said wiring patterns, the surfaces of the finger lead electrodes being smooth as compared to the surfaces of said wiring patterns; and a semiconductor chip secured within said aperture and electrically connected to said smooth surfaces of said finger lead electrodes.

2. In a semiconductor device including an insulating substrate, a metal film having a roughened surface attached to said insulating substrate, said metal film being shaped to include portions defining wiring patterns formed on the insulating substrate with roughened surfaces of said wiring patterns contiguous thereto and portions defining lead electrodes, and a semiconductor chip bonded to selected surfaces of said lead electrodes, the improvement comprising:

said selected surfaces of said lead electrodes being smooth as compared to the roughened surfaces of said wiring patterns contiguous with said substrate.

3. The semiconductor device of claim 1, wherein the wiring patterns and the finger lead electrodes are made of a copper film.

4. The semiconductor device of claim 3, wherein one surface of the wiring patterns confronting the insulating substrate has a roughness of three to fifteen microns (3-15μm) amplitude, and the wiring patterns are attached to the insulating substrate via adhesive.

5. The semiconductor device of claim 3, wherein said copper film is formed through the use of a plating method.

6. The semiconductor device of claim 1, wherein the semiconductor chip comprises bumps which are connected to the smoothed surface of the finger lead electrodes via an eutectic alloy.

7. The semiconductor device of claim 6, wherein the smoothed surface of the finger lead electrodes are coated with tin and the bumps are essentially made of gold, and wherein the bumps are connected to the finger lead electrodes via an eutectic alloy of Au-Sn.

8. The semiconductor device of claim 1, wherein the insulating substrate is made of a polyimide film.

* * * * *

UNITED STATES PATENT AND TRADEMARK OFFICE
CERTIFICATE OF CORRECTION

PATENT NO. : 4,151,543
DATED : April 24, 1979
INVENTOR(S) : Masao HAYAKAWA et al It is certified that error appears in the above-identified patent and that said Letters Patent are hereby corrected as shown below:

IN THE DRAWINGS:

Substitute the attached sheet of drawings for "Sheet 2 of 3" of the patent drawings.

Signed and Sealed this

First Day of April 1980

[SEAL]

Attest:

SIDNEY A. DIAMOND

Attesting Officer     Commissioner of Patents and Trademarks